(12) United States Patent
Yu et al.

(10) Patent No.: US 11,855,016 B2
(45) Date of Patent: Dec. 26, 2023

(54) SEMICONDUCTOR DEVICE AND METHOD OF MANUFACTURE

(71) Applicant: Taiwan Semiconductor Manufacturing Co., Ltd., Hsinchu (TW)

(72) Inventors: Chen-Hua Yu, Hsinchu (TW); Tin-Hao Kuo, Hsinchu (TW); Chung-Shi Liu, Hsinchu (TW); Hao-Yi Tsai, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 131 days.

(21) Appl. No.: 17/554,344

(22) Filed: Dec. 17, 2021

(65) Prior Publication Data

US 2022/0108961 A1 Apr. 7, 2022

Related U.S. Application Data

(60) Division of application No. 16/459,083, filed on Jul. 1, 2019, now Pat. No. 11,211,346, which is a continuation of application No. 15/827,139, filed on Nov. 30, 2017, now Pat. No. 10,340,236, which is a division of application No. 15/150,079, filed on May 9, 2016, now Pat. No. 9,842,815.

(60) Provisional application No. 62/300,176, filed on Feb. 26, 2016.

(51) Int. Cl.
*H01L 23/00* (2006.01)
*H01L 21/56* (2006.01)

(52) U.S. Cl.
CPC .............. *H01L 24/02* (2013.01); *H01L 24/05* (2013.01); *H01L 24/13* (2013.01); *H01L 24/19* (2013.01); *H01L 24/20* (2013.01); *H01L 21/568* (2013.01); *H01L 2224/024* (2013.01); *H01L 2224/0239* (2013.01); *H01L 2224/02315* (2013.01); *H01L 2224/02331* (2013.01); *H01L 2224/02379* (2013.01); *H01L 2224/0401* (2013.01); *H01L 2224/04105* (2013.01); *H01L 2224/05024* (2013.01); *H01L 2224/12105* (2013.01); *H01L 2224/13026* (2013.01); *H01L 2224/214* (2013.01); *H01L 2924/18162* (2013.01)

(58) Field of Classification Search
CPC ......... H01L 24/02; H01L 24/13; H01L 24/05; H01L 31/048; H01L 23/4334; H01L 33/52; H01L 33/54; H01L 33/56
See application file for complete search history.

(56) References Cited

U.S. PATENT DOCUMENTS

| | | | |
|---|---|---|---|
| 7,642,128 B1 | 1/2010 | Lin et al. |
| 7,977,763 B2 | 7/2011 | Lin et al. |
| 7,977,793 B2 | 7/2011 | Jung et al. |
| 8,361,842 B2 | 1/2013 | Yu et al. |

(Continued)

FOREIGN PATENT DOCUMENTS

| | | |
|---|---|---|
| CN | 103151333 A | 6/2013 |
| CN | 104795371 A | 7/2015 |
| KR | 20140113296 A | 9/2014 |

*Primary Examiner* — Jarrett J Stark
(74) *Attorney, Agent, or Firm* — Slater Matsil, LLP

(57) ABSTRACT

A semiconductor device has a top metal layer, a first passivation layer over the top metal layer, a first redistribution layer over the first passivation layer, a first polymer layer, and a first conductive via extending through the first polymer layer. The first polymer layer is in physical contact with the first passivation layer.

20 Claims, 9 Drawing Sheets

(56) References Cited

U.S. PATENT DOCUMENTS

| | | |
|---|---|---|
| 8,680,647 B2 | 3/2014 | Yu et al. |
| 8,703,542 B2 | 4/2014 | Lin et al. |
| 8,759,964 B2 | 6/2014 | Pu et al. |
| 8,778,738 B1 | 7/2014 | Lin et al. |
| 8,785,299 B2 | 7/2014 | Mao et al. |
| 8,803,306 B1 | 8/2014 | Yu et al. |
| 8,809,996 B2 | 8/2014 | Chen et al. |
| 8,829,676 B2 | 9/2014 | Yu et al. |
| 8,877,554 B2 | 11/2014 | Tsai et al. |
| 9,595,482 B2 | 3/2017 | Chen |
| 10,109,589 B2 | 10/2018 | Chiu et al. |
| 2004/0166659 A1 | 8/2004 | Lin et al. |
| 2009/0309212 A1 | 12/2009 | Shim et al. |
| 2010/0320624 A1 | 12/2010 | Kang et al. |
| 2011/0121295 A1 | 5/2011 | Kuan et al. |
| 2011/0291288 A1 | 12/2011 | Wu et al. |
| 2013/0026468 A1 | 1/2013 | Yoshimuta et al. |
| 2013/0062760 A1 | 3/2013 | Hung et al. |
| 2013/0062761 A1 | 3/2013 | Lin et al. |
| 2013/0168848 A1 | 7/2013 | Lin et al. |
| 2013/0307140 A1 | 11/2013 | Huang et al. |
| 2014/0151890 A1 | 6/2014 | Mao et al. |
| 2014/0203429 A1 | 7/2014 | Yu et al. |
| 2014/0225222 A1 | 8/2014 | Yu et al. |
| 2014/0252646 A1 | 9/2014 | Hung et al. |
| 2014/0264930 A1 | 9/2014 | Yu et al. |
| 2015/0336270 A1 | 11/2015 | Storr |
| 2016/0056056 A1 | 2/2016 | Chen et al. |
| 2016/0148887 A1 | 5/2016 | Yu et al. |
| 2016/0148904 A1 | 5/2016 | Zhai et al. |
| 2017/0162519 A1 | 6/2017 | Ko et al. |
| 2017/0338188 A1 | 11/2017 | Chen et al. |
| 2017/0352613 A1 | 12/2017 | Baloglu et al. |
| 2018/0033747 A1 | 2/2018 | Shih et al. |
| 2018/0299882 A1 | 10/2018 | Kichkaylo |
| 2019/0051626 A1 | 2/2019 | Fang et al. |

SEMICONDUCTOR DEVICE AND METHOD OF MANUFACTURE

This application is a divisional of U.S. patent application Ser. No. 16/459,083, filed on Jul. 1, 2019, entitled "Semiconductor Device and Method of Manufacture," which is a continuation of U.S. patent application Ser. No. 15/827,139, filed on Nov. 30, 2017 (now U.S. Pat. No. 10,340,236, issued Jul. 2, 2019), entitled "Semiconductor Device and Method of Manufacture," which is a divisional of U.S. patent application Ser. No. 15/150,079, filed on May 9, 2016 (now U.S. Pat. No. 9,842,815, issued Dec. 12, 2017), entitled "Semiconductor Device and Method of Manufacture," which claims the benefit of U.S. Provisional Application No. 62/300,176, filed on Feb. 26, 2016, entitled "Semiconductor Device and Method of Manufacture," which applications are hereby incorporated herein by reference.

BACKGROUND

Since the invention of the integrated circuit (IC), the semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more components to be integrated into a given area.

However, merely decreasing the minimum feature size of transistors, diodes, resistors, capacitors and the like are merely one aspect that can be improved in the attempts to reduce the overall size of semiconductors devices. Other aspects that are currently under review include other aspects of the semiconductor devices. Improvements in these other structures are being investigated for reductions in size.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
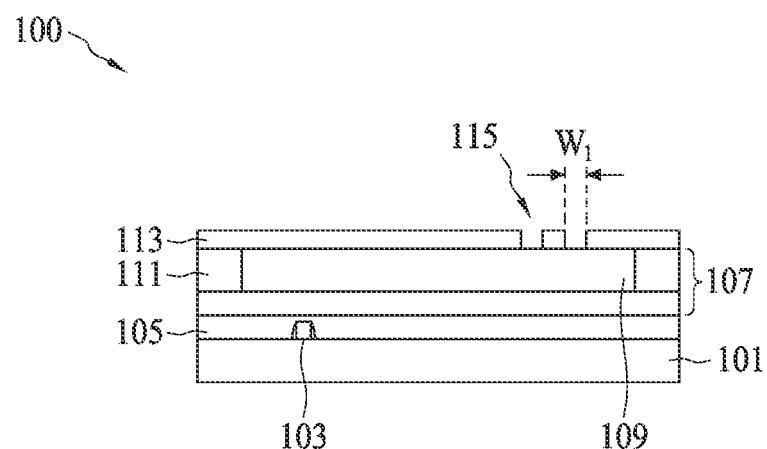
FIG. 1 illustrates a semiconductor device with a top meal layer and a first passivation layer in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

With reference now to FIG. 1, there is shown a semiconductor device 100 with a substrate 101, active devices 103 on the substrate 101, an interlayer dielectric (ILD) layer 105 over the active devices 103, and metallization layers 107 over the ILD layer 105. The substrate 101 may be substantially conductive or semiconductive with an electrical resistance of less than $10^3$ ohm-meter and may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates. Additionally, the substrate 101 at this point in the process may be part of a semiconductor wafer (the full wafer of which is not illustrated in FIG. 1) that will be singulated in a later step.

The active devices 103 are represented in FIG. 1 as a single transistor. However, as one of skill in the art will recognize, a wide variety of active devices such as capacitors, resistors, inductors and the like may be used to generate the desired structural and functional requirements of the design for the semiconductor device 100. The active devices 103 may be formed using any suitable methods either within or else on the surface of the substrate 101.

The ILD layer 105 may comprise a material such as boron phosphorous silicate glass (BPSG), although any suitable dielectrics may be used. The ILD layer 105 may be formed using a process such as PECVD, although other processes, such as LPCVD, may alternatively be used. The ILD layer 105 may be formed to a thickness of between about 100 Å and about 3,000 Å.

The metallization layers 107 are formed over the substrate 101, the active devices 103, and the ILD layer 105 and are designed to connect the various active devices 103 to form functional circuitry. While illustrated in FIG. 1 as two layers, the metallization layers 107 are formed of alternating layers of dielectric and conductive material and may be formed through any suitable process (such as deposition, damascene, dual damascene, etc.). In an embodiment there may be four layers of metallization separated from the substrate 101 by the ILD layer 105, but the precise number of metallization layers 107 is dependent upon the design of the semiconductor device 100.

At the top of the metallization layers 107 there is a top metal layer 109 surrounded by a top dielectric layer 111. In an embodiment the top metal layer 109 comprises the conductive material, such as copper or other suitable conductor, formed within the top dielectric layer 111, which may be any suitable dielectric, such as a low-k dielectric material. The top dielectric layer 111 may be initially formed over the remainder of the metallization layers 107 and then the top metal layer 109 may be formed within the top dielectric layer 111 using, e.g., a damascene or dual damascene process, although any suitable process or materials may be used.

A first passivation layer 113 may be formed on the substrate 101 over the metallization layers 107 (and the top metal layer 109 and top dielectric layer 111 within the metallization layers 107). The first passivation layer 113 may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The first passivation layer 113 may be formed through a process such as chemical vapor deposition (CVD), although any suitable process may be utilized, and may have a thickness between about 0.5 µm and about 5 µm, such as about 9.25 KA.

After the first passivation layer 113 has been formed, first openings 115 may be made through the first passivation layer 113 by removing portions of the first passivation layer 113 to expose at least a portion of the top metal layer 109. The first openings 115 allow for contact between the top metal layer 109 and a first redistribution layer 201 (not illustrated in FIG. 1 but illustrated and described below with respect to FIG. 2). The first openings 115 may be formed using a suitable photolithographic mask and etching process, although any suitable process to expose portions of the top metal layer 109 may be used, and the first openings 115 may be formed to have a first width $W_1$ of between about 1 µm and about 8 µm, such as about 3 µm. Additionally, the first openings 115 may be made with a single extension through the first passivation layer 113, or any suitable number of extensions such as between two extensions through the first passivation layer 113 (as illustrated in FIG. 1) and six extensions through the first passivation layer 113.

Figure 2:
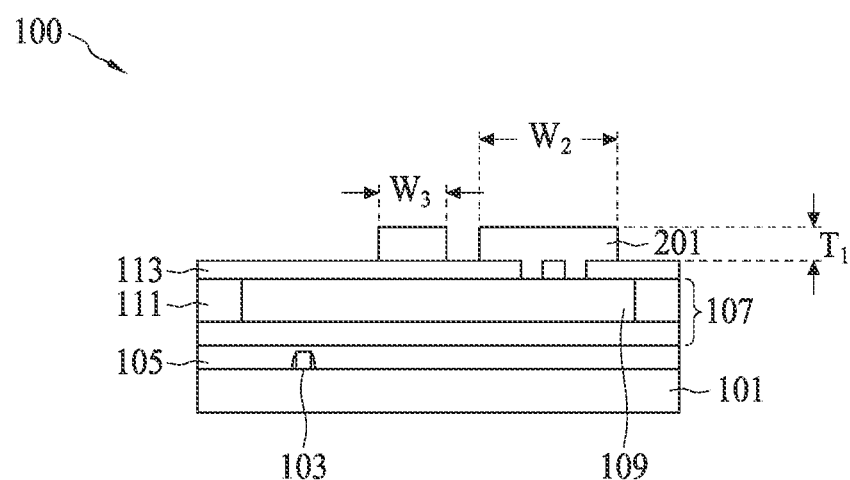
FIG. 2 illustrates a formation of a first redistribution layer in accordance with some embodiments.

FIG. 2 illustrates a formation of the first redistribution layer 201. The first redistribution layer 201 may comprise aluminum, but other materials, such as copper, may alternatively be used. The first redistribution layer 201 may be formed using a deposition process, such as sputtering, to form a layer of material (not separately shown in FIG. 2) and portions of the layer of material may then be removed through a suitable process (such as photolithographic masking and etching) to form the first redistribution layer 201. However, any other suitable process may be utilized to form the first redistribution layer 201. The first redistribution layer 201 may be formed to have a first thickness $T_1$ over the first passivation layer 113 of between about 1 µm and about 10 µm, such as about 2.8 µm.

The first redistribution layer 201 may be formed with a first section, such as a landing pad section, that extends through the first openings 115 of the first passivation layer 113 to make electrical connection with the underlying top metal layer 109 to provide electrical connectivity to the top metal layer 109 as well as to provide a landing pad region for connection to overlying conductive structures. In an embodiment the first section may be formed with a second width W2 of between about 15 µm and about 100 µm, such as about 50 µm.

Additionally, a second section of the first redistribution layer 201 may be formed over the first passivation layer 113. In an embodiment the second section of the first redistribution layer 201 may be used to provide routing and redistribution of the electrical signals, and may be formed to have a third width $W_3$ of between about 1 µm and about 20 µm, such as about 2 µm. However, any suitable dimensions may be used for the first section and the second section of the first redistribution layer 201.

Figure 3:
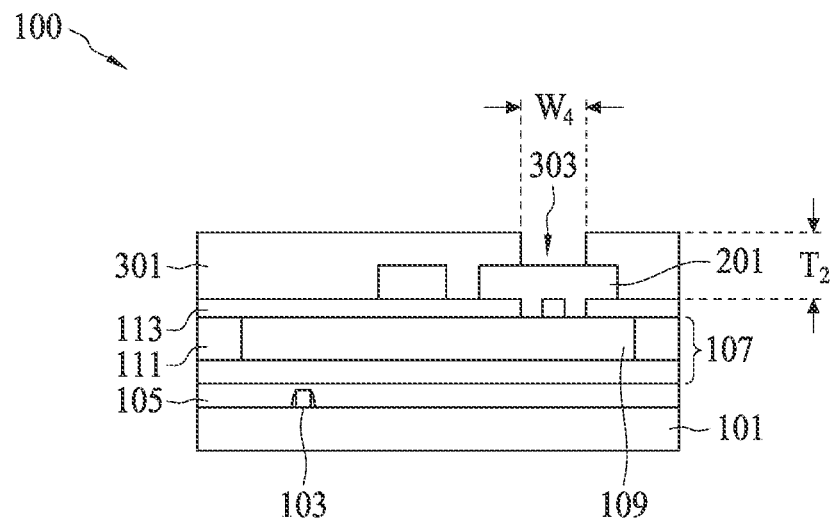
FIG. 3 illustrates a formation of a first protective layer in accordance with some embodiments.

FIG. 3 illustrates a formation of a first protective layer 301 over and in direct physical contact with the first redistribution layer 201. In an embodiment the first protective layer 301 is a polymer layer and is formed of a polymer such as a polyimide, polybenzoxazole (PBO), benzocyclobutene (BCB), and the like, using a process such as spin coating, laminating, or the like. The first protective layer 301 may be formed to a second thickness $T_2$ over the first passivation layer 113 of between about 2 µm and about 12 µm, such as about 5 µm. However, any suitable thickness may be utilized.

In an embodiment the first protective layer 301 may be formed in situ after the formation the first redistribution layer 201 and before the first redistribution layer 201 has been exposed to a reactive atmosphere such as an ambient atmosphere which comprises oxygen. By forming the first protective layer 301 in situ and before exposure to a reactive atmosphere, the need for a separate passivation layer over the first redistribution layer 201 in order to protect the first redistribution layer 201 between processes may be removed. As such, the unnecessary passivation layer may be removed from the process, making the device thinner and smaller and the manufacturing process more efficient.

After the first protective layer 301 has been formed, second openings 303 may be made through the first protective layer 301 by removing portions of the first protective layer 301 to expose at least a portion of the first redistribution layer 201. The second opening 303 allows for contact between the first redistribution layer 201 and a first conductive via 401 (otherwise known as a via0, not illustrated in FIG. 3 but illustrated and described below with respect to FIG. 4). The second opening 303 may be formed using a suitable photolithographic mask and etching process, although any suitable process to expose portions of the first redistribution layer 201 may be used. Additionally, the second opening 303 may be formed to have a fourth width $W_4$ of between about 5 µm and about 95 µm, such as about 10 µm, although any suitable thickness may be utilized.

Figure 4:
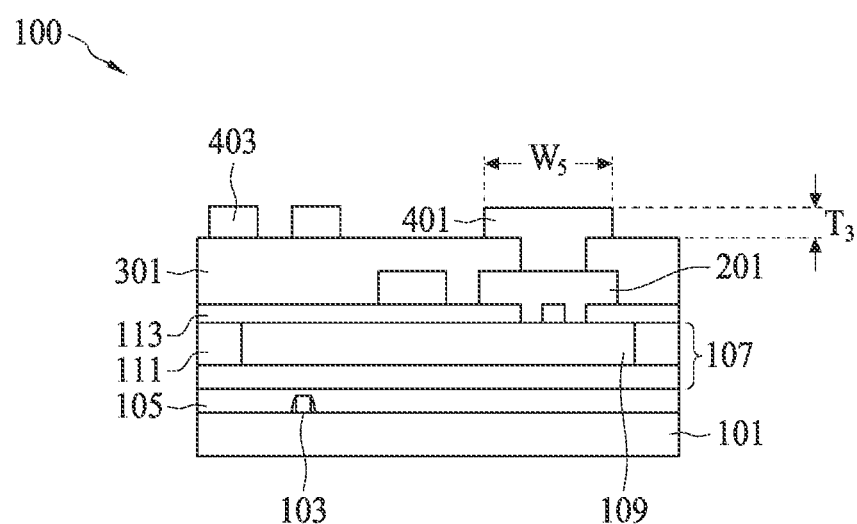
FIG. 4 illustrates a formation of a first conductive via in accordance with some embodiments.

FIG. 4 illustrates a formation of the first conductive via 401 through the second opening 303 and in electrical connection with the first redistribution layer 201. In an embodiment, the first conductive via 401 may be formed by initially forming a seed layer (not separately illustrated in FIG. 4). The seed layer is a thin layer of a conductive material that aids in the formation of a thicker layer during subsequent processing steps. The seed layer may comprise a layer of titanium about 1,000 Å thick followed by a layer of copper about 5,000 Å thick. The seed layer may be created using processes such as sputtering, evaporation, or PECVD processes, depending upon the desired materials. The seed layer may be formed to have a thickness of between about 0.3 µm and about 1 µm, such as about 0.5 µm.

Once the seed layer has been formed the first conductive via 401 may be formed over the seed layer. In an embodiment the first conductive via 401 comprises one or more conductive materials, such as copper, tungsten, other conductive metals, or the like, and may be formed, for example, by electroplating, electroless plating, or the like. In an embodiment, a first photoresist (not separately illustrated in FIG. 4) is placed on the seed layer and patterned to expose the seed layer where the first conductive via 401 is desired to be formed. Once patterned, an electroplating process is used wherein the seed layer and the first photoresist are submerged or immersed in an electroplating solution. The seed layer surface is electrically connected to the negative side of an external DC power supply such that the seed layer functions as the cathode in the electroplating process. A solid conductive anode, such as a copper anode, is also immersed in the solution and is attached to the positive side of the power supply. The atoms from the anode are dissolved into the solution, from which the cathode, e.g., the seed layer, acquires the dissolved atoms, thereby plating the exposed conductive areas of the seed layer within the opening of the first photoresist.

Once the first conductive via 401 has been formed using the first photoresist and the seed layer, the first photoresist may be removed using a suitable removal process. In an embodiment, a plasma ashing process may be used to remove the first photoresist, whereby the temperature of the first photoresist may be increased until the first photoresist experiences a thermal decomposition and may be removed. However, any other suitable process, such as a wet strip, may alternatively be utilized. The removal of the first photoresist may expose the underlying portions of the seed layer.

After the removal of the first photoresist exposes the underlying seed layer, these portions are removed. In an embodiment the exposed portions of the seed layer (e.g., those portions that are not covered by the first conductive via 401) may be removed by, for example, a wet or dry etching process. For example, in a dry etching process reactants may be directed towards the seed layer, using the first conductive via 401 as a mask. Alternatively, etchants may be sprayed or otherwise put into contact with the seed layer in order to remove the exposed portions of the seed layer.

In an embodiment the first conductive via 401 may be formed to have a third thickness $T_3$ over the first protective layer 301 of less than about 15 µm, such as about 10 µm, or about 3 µm. Additionally, the first conductive via 401 may be formed to have a fifth width $W_5$ of between about 20 µm and about 120 µm, such as about 50 µm. However, any suitable dimensions may be utilized to form the first conductive via 401. By forming the first conductive via 401 to have the third thickness $T_3$ of less than about 15 µm, cost savings may be obtained by saving time and materials during the formation of the first conductive via 401. Additionally, by forming the first conductive via 401 to have the third thickness $T_3$, additional reductions may be obtained. For example, when the first conductive via 401 is formed with the third thickness $T_3$, the pitch between adjacent ones of the first conductive vias 401 (only one of which is illustrated in FIG. 4) may be reduced to be between about 40 µm and about 100 µm, such as about 80 µm. However, any suitable pitch may be utilized.

In addition to the first conductive via 401, routing lines 403 may also be formed over the first protective layer 301 in order to allow for additional routing and connectivity options. In an embodiment the routing lines 403 may be formed simultaneously with and at the same time as the first conductive via 401, such that the routing lines 403 have the same third thickness $T_3$.

Figure 5:
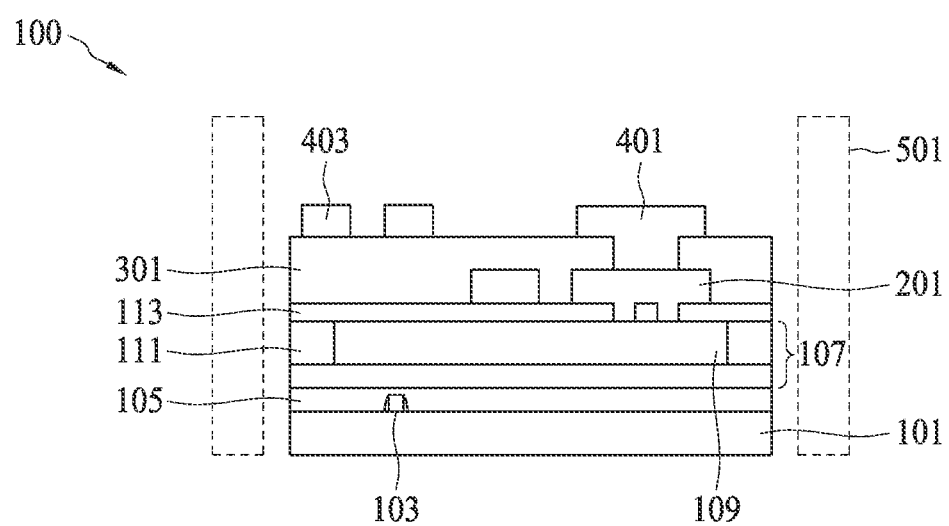
FIG. 5 illustrates a singulation process in accordance with some embodiments.

FIG. 5 illustrates that, once the exposed portions of the seed layer have been removed, a singulation may be performed to separate the semiconductor device 100 from the rest of the wafer (not separately illustrated). In an embodiment the singulation may be performed by using a saw blade (represented in FIG. 5 by the dashed boxes labeled 501) to slice through the substrate 101 and overlying layers, thereby separating one section from another to form the semiconductor device 100. However, as one of ordinary skill in the art will recognize, utilizing a saw blade to singulate the semiconductor device 100 is merely one illustrative embodiment and is not intended to be limiting. Alternative methods for singulating the semiconductor device 100, such as utilizing one or more etches to separate the semiconductor device 100 or to use a laser to separate the semiconductor device 100, may alternatively be utilized. These methods and any other suitable methods may alternatively be utilized to singulate the semiconductor device 100.

Figure 6A:
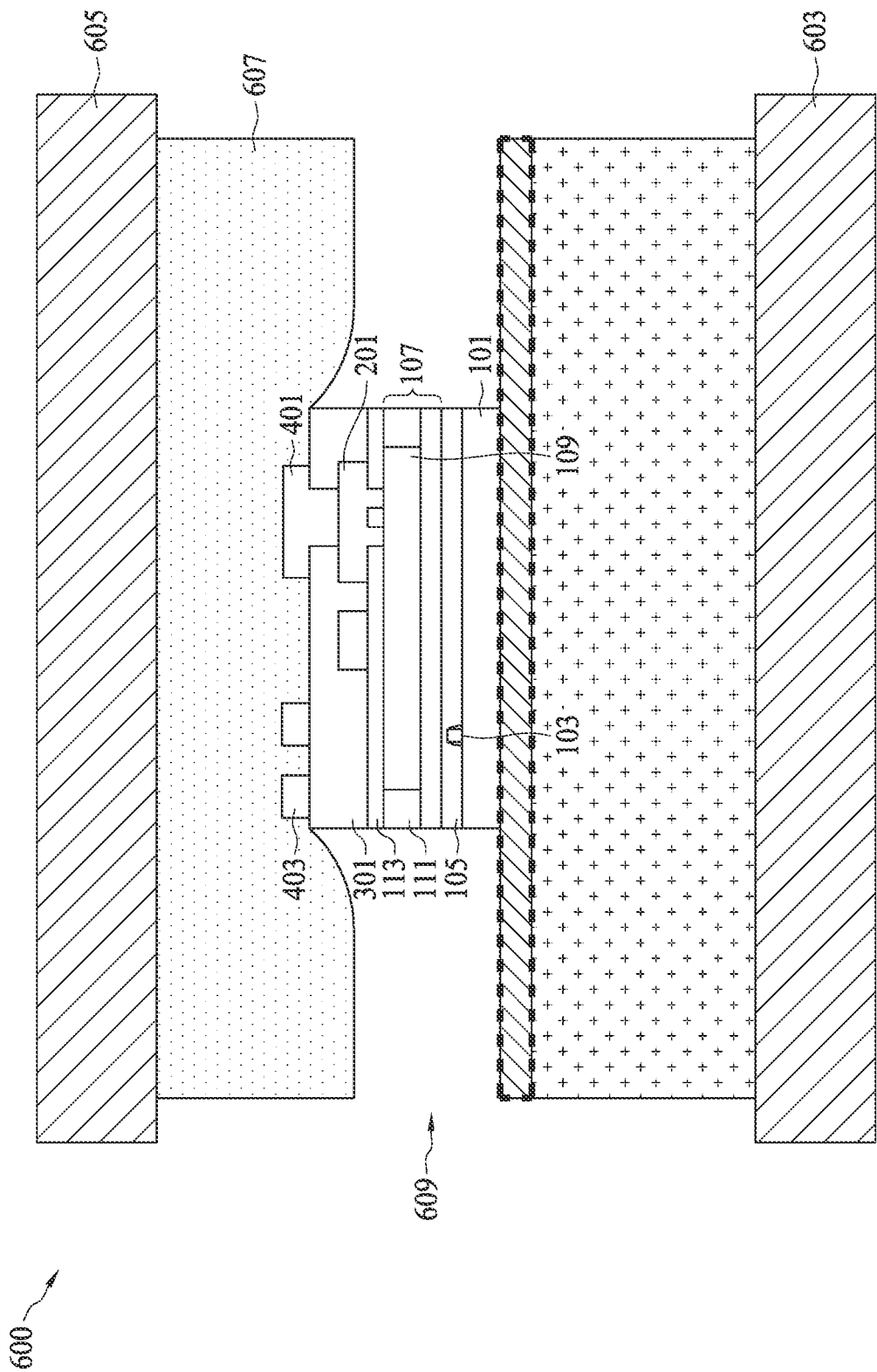
FIGS. 6A-6C illustrates an encapsulation process in accordance with some embodiments.
Figure 6B:
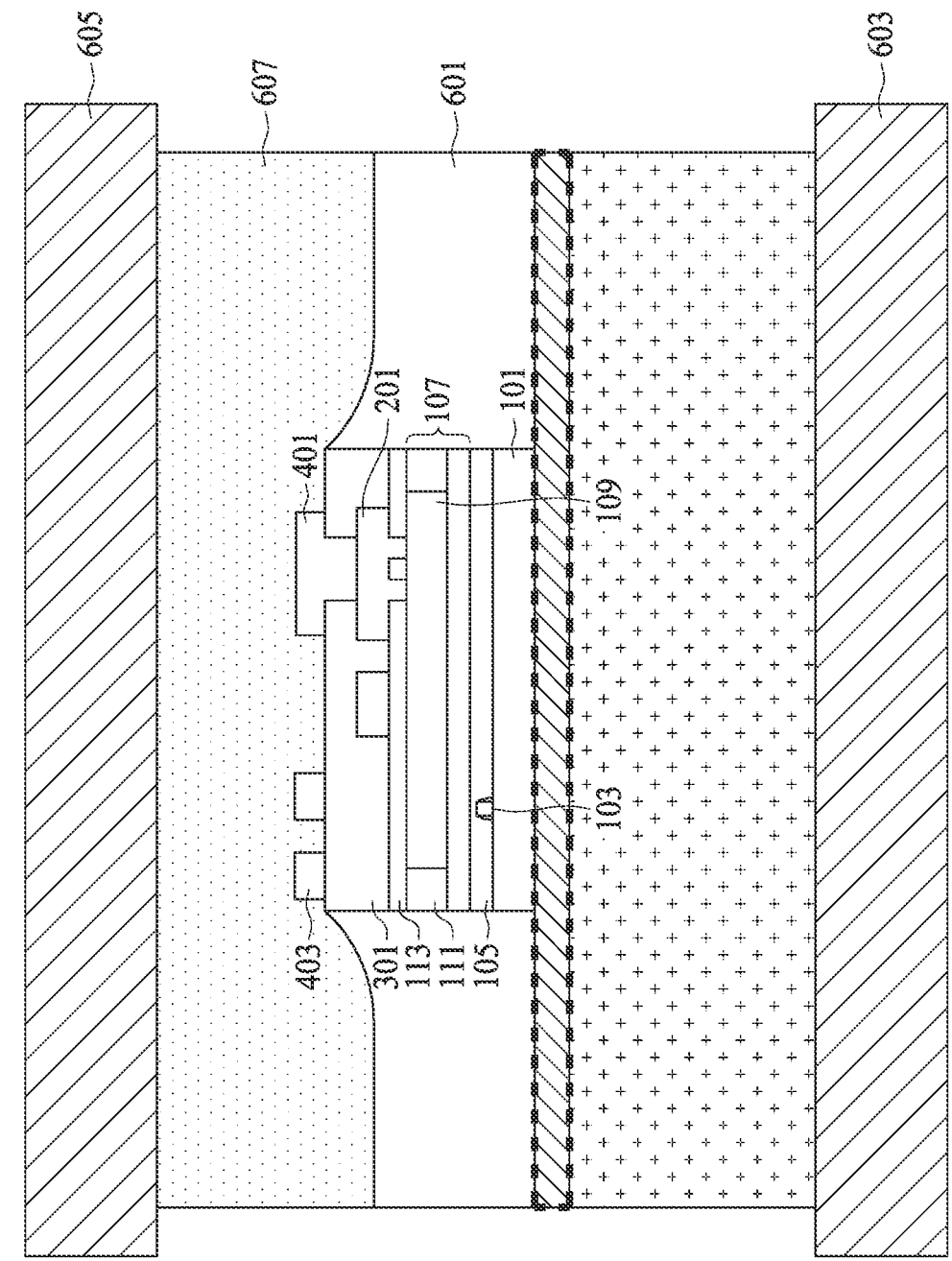
Figure 6C:
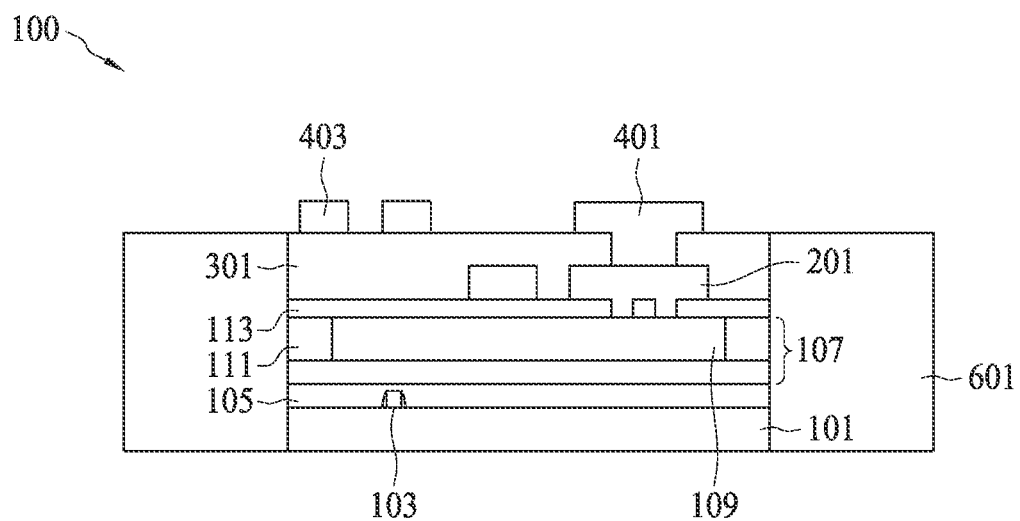

FIGS. 6A-6C illustrate an encapsulation of the substrate 101 with, e.g., an encapsulant 601. In an embodiment the encapsulation of the substrate 101 may be performed as described in U.S. patent application Ser. No. 14/555,338, filed on Nov. 26, 2014, which reference is incorporated herein by reference. For example, and as illustrated starting in FIG. 6A, the substrate 101 may be encapsulated using a transfer molding process, whereby the substrate 101 is positioned between a bottom plate 603 and a top plate 605 of a molding apparatus 600. The top plate 605 and the bottom plate 603 may include a suitable material for providing structural support such as a metal, ceramic, or the like.

In some embodiments, a polymer layer 607 is disposed on the top plate 605 (e.g., facing the substrate 101). The polymer layer 607 may include a lamination film material, such as polyimide, PBO, epoxy, an underfill film, a molded underfill film, and the like either with or without a filler material. The polymer layer 607 may be compressible such that it may be shaped by the structures on the substrate 101 (e.g., the first conductive via 401) when the polymer layer 607 contacts the structures. In some embodiments, the polymer layer 607 has a thickness ranging from about 10 µm to about 100 µm. In some embodiments, a release film (not shown) is disposed between the top plate 605 and the polymer layer 607.

After the substrate 101 has been placed, the top plate 605 and the bottom plate 603 are pressed together, and the polymer layer 607 contacts the top surface of the structures on the substrate 101. The polymer layer 607 may cover the top surface of the structures on the substrate 101. Gaps 609 may remain disposed between the top plate 605 and the bottom plate 603. The lack of any support material under polymer layer 607 may result in a non-planar bottom surface of the polymer layer 607. For example, as shown in FIG. 6A, the polymer layer 607 is partially compressed by the structures on the substrate 101. A portion of the bottom surface of the polymer layer 607 in the gaps 609 is lower than the top surface of the first conductive via 401 and the first protective layer 301. In some embodiments, the non-planar bottom surface in the gaps 609 includes a non-planar portion recessed from the top surface of the first conductive via 401 and further includes a flat portion away from the substrate 101. Prior to its placement on the substrate 101, the polymer layer 607 may be uncured or only partially cured.

Afterwards, referring to FIG. 6B, the encapsulant 601 is formed in gaps 609. In some embodiments, the encapsulant 601 is dispensed in liquid form. The encapsulant 601 may not flow over top surfaces of the structures on the substrate 101 since it is sealed by the polymer layer 607. Afterwards, a curing process may be performed to solidify the encapsulant 601. During the molding process, a top surface of the encapsulant 601 may contact the bottom surface of the polymer layer 607, and thus the top surface of the encapsulant 601 may have a similar profile as the bottom surface of the polymer layer 607. As a result, the top surface of the encapsulant 601 is a non-planar surface recessed from the top surfaces of the structures on the substrate 101. For example, the top surface of the encapsulant 601 may be recessed from the top surface of the first conductive via 401 and the first protective layer 301. In some embodiments, the top surface of the encapsulant 601 includes a curved or linear inclined portion recessed from the top surface of the structures on the substrate 101 and also includes a flat portion away from the substrate 101. Once encapsulated, the substrate 101 with the encapsulant 601 may be removed from the molding apparatus 600, as illustrated in FIG. 6C. As can be seen, in this process, when the molding apparatus 600 is removed, the top surfaces of the first conductive via 401 remain exposed.

However, while the transfer molding process (otherwise known as an exposure molding process) described above is one method of encapsulation that may be used, the embodiments are not limited to the transfer molding process. Rather, any suitable molding process, such as a face-down molding process, or any other suitable method of manufacturing, such as a molding process coupled with a separate removal process to expose the first conductive via 401, may be used. All such processes are fully intended to be included within the scope of the embodiments.

Figure 7:
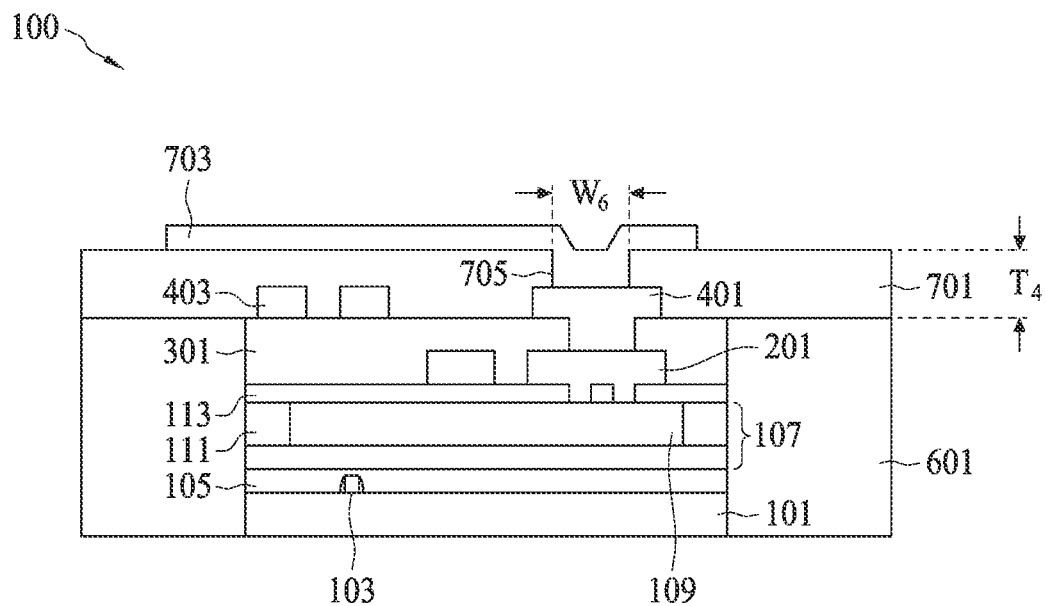
FIG. 7 illustrates a formation of a second redistribution layers in accordance with some embodiments.

FIG. 7 illustrates that, after the encapsulation, a second protective layer 701 and a post-passivation interconnect (PPI) layer 703 may be formed over both the encapsulant 601 as well as the first conductive via 401 as the first fan out layer to be formed over the semiconductor device 100. In an embodiment the second protective layer 701 may be formed using similar materials and similar processes as the first protective layer 301, described above with respect to FIG. 3. For example, the second protective layer 701 may be a polyimide material formed using a spin-on process. However, any suitable material and process of formation may be utilized to form or place the second protective layer 701. In an embodiment the second protective layer 701 may be formed so as to cover the first conductive via 401, the first protective layer 301, and also to extend over the encapsulant 601. Additionally, the second protective layer 701 may be formed to have a fourth thickness $T_4$ over the encapsulant 601 of between about 2 μm and about 8 μm, such as about 5 μm. However, any suitable thickness may be utilized.

After the second protective layer 701 has been formed, a third opening 705 may be made through the second protective layer 701 by removing portions of the second protective layer 701 to expose at least a portion of the first conductive via 401. The third opening 705 allows for contact between the first conductive via 401 and the PPI layer 703. The third opening 705 may be formed using a suitable photolithographic mask and etching process, although any suitable process to expose portions of the first conductive via 401 may be used. Additionally, the third opening 705 may be formed to have a sixth width $W_6$ of between about 10 μm and about 30 μm, such as about 20 μm, although any suitable width may be utilized.

After the first conductive via 401 has been exposed, the PPI layer 703 may be formed to extend along the second protective layer 701. The PPI layer 703 may be utilized as a redistribution layer or fan-out layer to allow first external connections 905 (not illustrated in FIG. 7 but illustrated and discussed further below with respect to FIG. 9) that are electrically connected to the first conductive via 401 to be placed in any desired location on the semiconductor device 100, instead of limiting the location of the first external connections 905 to the region directly over the first conductive via 401. In an embodiment the PPI layer 703 may be formed by initially forming a seed layer (not separately illustrated in FIG. 7) of a titanium copper alloy through a suitable formation process such as CVD or sputtering. A photoresist (not shown) may then be formed to cover the seed layer, and the photoresist may then be patterned to expose those portions of the seed layer that are located where the PPI layer 703 is desired to be located.

Once the photoresist has been formed and patterned, a conductive material, such as copper, may be formed on the seed layer through a deposition process such as plating. The conductive material may be formed to have a thickness of between about 1 μm and about 10 μm, such as about 5 μm. However, while the material and methods discussed are suitable to form the conductive material, these materials are merely exemplary. Any other suitable materials, such as AlCu or Au, and any other suitable processes of formation, such as CVD or PVD, may alternatively be used to form the PPI layer 703.

Once the conductive material has been formed, the photoresist may be removed through a suitable removal process such as ashing. Additionally, after the removal of the photoresist, those portions of the seed layer that were covered by the photoresist may be removed through, for example, a suitable etch process using the conductive material as a mask.

Figure 8:
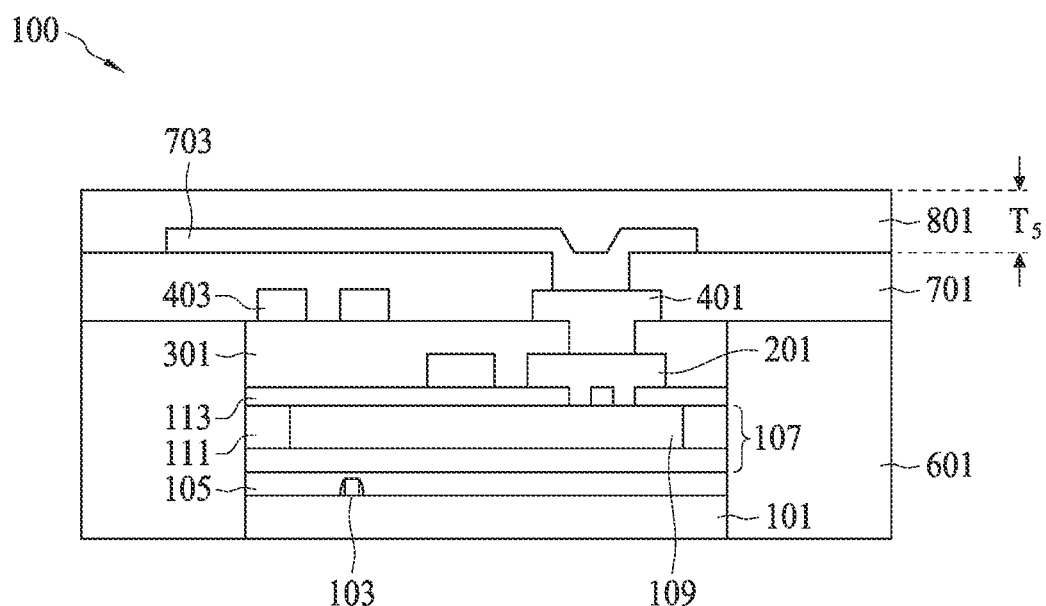
FIG. 8 illustrates a formation of a second protective layer in accordance with some embodiments.

FIG. 8 illustrates a formation of a third protective layer 801 over the PPI layer 703. In an embodiment the third protective layer 801 may be formed using similar materials and similar processes as the first protective layer 301, described above with respect to FIG. 3. For example, the third protective layer 801 may be a polyimide material formed using a spin-on process. However, any suitable material and process of formation may be utilized to form or place the third protective layer 801. In an embodiment the third protective layer 801 may be formed so as to cover the PPI layer 703 and the second protective layer 701. Additionally, the third protective layer 801 may be formed to have a fifth thickness $T_5$ over the second protective layer 701 of between about 3 μm and about 10 μm, such as about 5 μm. However, any suitable thickness may be utilized.

Figure 9:
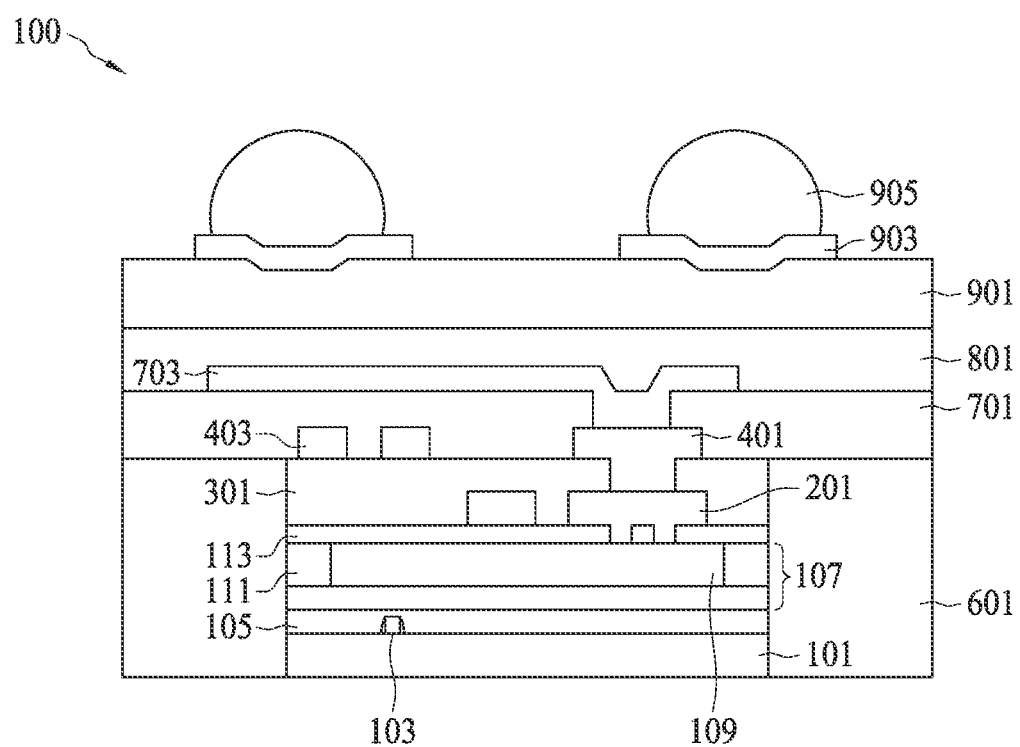
FIG. 9 illustrates a formation of external connections in accordance with some embodiments.

FIG. 9 illustrates a formation of an upper layer 901, underbump metallizations 903, and the first external connections 905. In an embodiment the upper layer 901 comprises optional additional PPI layers (not separately illustrated) that are used to route and interconnect the signals from the PPI layer 703 to respective ones of the underbump metallizations 903. The additional PPI layers may be formed as described above with respect to the PPI layer 703, such as by patterning the third protective layer 801, depositing a seed layer and a photoresist, and plating conductive material onto portions of the seed layer exposed through the photoresist. Once each of the conductive layers has been formed, a dielectric layer is formed over the conductive layers.

Once the upper layer 901 has been formed, the underbump metallizations 903 may be formed in electrical connection with the PPI layer 703 either through, e.g., the PPI layers of the upper layer 901 or else in direct connection with the PPI layer 703 (in an embodiment in which the upper layer 901 is not utilized). In an embodiment the underbump metallizations 903 may comprise three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the underbump metallizations 903. Any suitable materials or layers of material that may be used for the underbump metallizations 903 are fully intended to be included within the scope of the embodiments.

In an embodiment the underbump metallizations 903 are created by forming each layer over the upper layer 901 and in electrical connection with the conductive portions of the upper layer 901 in order to electrically connect the underbump metallizations 903 with the PPI layer 703. The forming of each layer may be performed using a plating process, such as electrochemical plating, although other processes of formation, such as sputtering, evaporation, or PECVD process, may alternatively be used depending upon the desired materials. The underbump metallizations 903 may be formed to have a thickness of between about 0.7 µm and about 10 µm, such as about 5 µm.

Once the underbump metallizations 903 have been formed, the first external connections 905 may be formed on the underbump metallizations 903. In an embodiment the first external connections 905 may be a ball grid array and may comprise a material such as tin, or other suitable materials, such as silver, lead-free tin, or copper. In an embodiment in which the first external connections 905 are tin solder bumps, the first external connections 905 may be formed by initially forming a layer of tin through such commonly used methods such as evaporation, electroplating, printing, solder transfer, ball placement, etc, to a thickness of, e.g., about 100 µm. Once a layer of tin has been formed on the structure, a reflow may be performed in order to shape the material into the desired bump shape.

By forming devices using the methods and structure described herein, a more compact and smaller device may be achieved. Additionally, a more efficient process that utilizes fewer raw materials which has an increased throughput may be obtained. As such, a more efficient and cost-effective device may be obtained.

Figure 10:
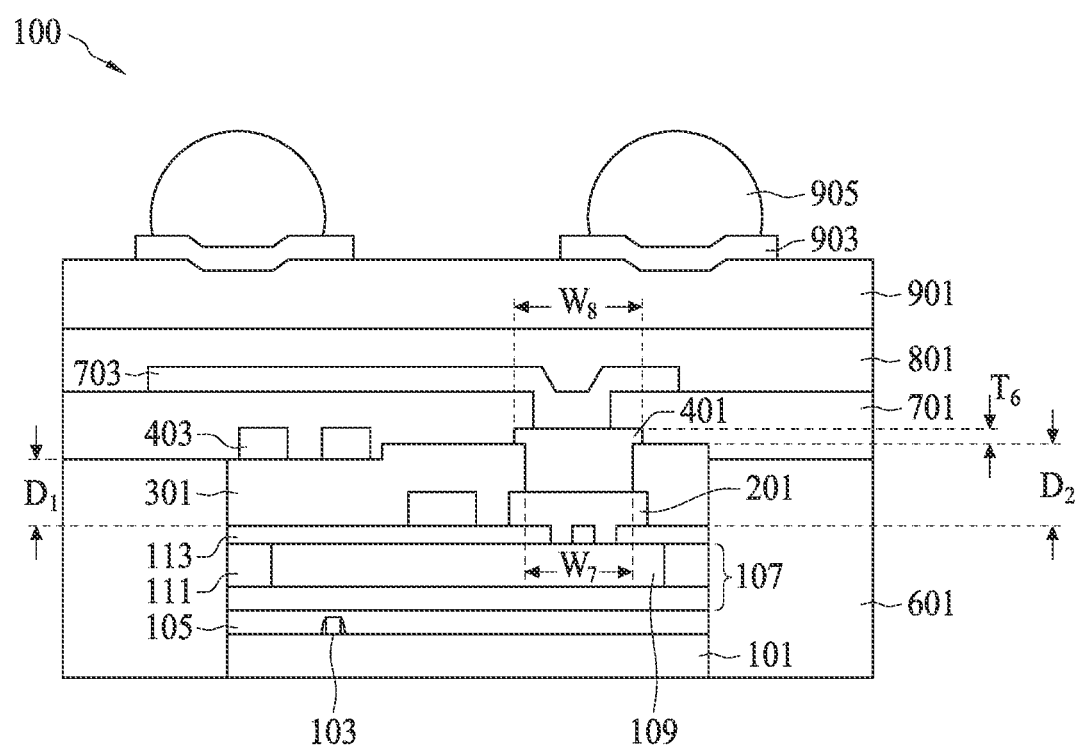
FIG. 10 illustrates an embodiment in which the first protective layer utilizes a non-polymer material in accordance with some embodiments.

FIG. 10 illustrates another embodiment that uses the first protective layer 301 to protect the first redistribution layer 201. In this embodiment the first protective layer 301 may be a polymer material such as polyimide or else may be a non-polymer material to form a second passivation layer. In an embodiment the non-polymer material may be a layer of silicon oxide or silicon nitride, or else may be a composite of a layer of silicon oxide and a layer of silicon nitride. However, any suitable material may be utilized.

In this embodiment the first protective layer 301 may be formed using a deposition process such as chemical vapor deposition, physical vapor deposition, or atomic layer deposition, although any suitable process may be used. Additionally, the first protective layer 301 may be deposited in a conformal manner such that the first protective layer 301 takes on the shape of the underlying structures (e.g., the first redistribution layer 201). As such, the first protective layer 301 in this embodiment may have an upper surface that is located at multiple distances from the first passivation layer 113. When the first protective layer 301 is in physical contact with the first passivation layer 113, an upper surface of the first protective layer 301 may be located a first distance $D_1$ away from the first passivation layer 113 of between about 4 µm and about 1 µm, such as about 2 µm. Additionally, when the first protective layer 301 is located over the first redistribution layer 201, an upper surface of the first protective layer 301 may be located a second distance $D_2$ away from the first passivation layer 113 of between about 14 µm and about 2 µm, such as about 4.5 µm. However, any suitable thicknesses may be utilized.

Further, in an embodiment in which the first protective layer 301 is a composite film, the silicon oxide layer may be formed to a thickness of between about 2.5 µm and about 0.5 µm, such as about 1.2 µm. Additionally, in this embodiment the silicon nitride film may be formed to a thickness of between about 3 µm and about 0.3 µm, such as about 0.7 µm. However, any suitable thicknesses may be utilized for each layer of the composite film.

Once the first protective layer 301 has been formed, the first protective layer 301 may be patterned in order to form the second openings 303 and allow for electrical connection with the first redistribution layer 201. In an embodiment the first protective layer 301 may be patterned as described above with respect to FIG. 3. In this embodiment the second openings 303 through the first protective layer 301 may be formed to a seventh width $W_7$ of between about 5 µm and about 95 µm, such as about 10 µm, although any suitable width may be utilized. In an embodiment the first conductive via 401 may be formed to have a third thickness $T_6$ over the first protective layer 301 of less than about 15 µm, such as about 10 µm, or about 3 µm. Additionally, the first conductive via 401 may be formed to have an eighth width $W_8$ over the first protective layer 301 of between about 20 µm and about 120 µm, such as about 50 µm.

After the first protective layer 301 has been patterned to form the second openings 303, the first conductive via 401 may be formed through the second openings 303 in order to make physical and electrical contact with the first redistribution layer 201. In an embodiment the first conductive via 401 may be formed as described above with respect to FIG. 4. For example, a seed layer may be initially formed, a photoresist is placed and patterned over the seed layer, and the seed layer is used in a plating process to form the first conductive via 401 (along with the routing lines 403 if desired). In this embodiment the first conductive via 401 may be formed to have a constant width such as the seventh width $W_7$, although any suitable width may be utilized, and also may be formed to have a sixth thickness $T_6$ over the first protective layer 301 of less than about 15 µm, such as about 10 µm, or about 3 µm, although any suitable thickness may be utilized.

By forming the first protective layer 301 and the first conductive via 401 as described herein, a more compact structure may be manufactured using fewer materials. As such, a smaller structure may be made for a cheaper amount, leading to an overall more efficient process.

In accordance with an embodiment, a method of manufacturing a semiconductor device comprising applying a first polymer layer over a first redistribution layer, the first redistribution layer being located over a semiconductor substrate, is provided. The first polymer layer is patterned to expose at least a portion of the first redistribution layer, and a first conductive via is formed through the first polymer layer and in electrical connection with the first redistribution layer, wherein the first conductive via has a first thickness no greater than 10 µm. The semiconductor substrate is encapsulated with an encapsulant after the forming the first conductive via, wherein the encapsulant is not in physical contact with the first conductive via. A second polymer layer is deposited over the encapsulant and in physical contact with the first conductive via, and a first fan-out redistribution layer is formed over and through the second polymer layer.

In accordance with another embodiment, a method of manufacturing a semiconductor device comprising forming active devices onto a first side of a semiconductor substrate, and forming a plurality of metallization layers over the active devices, wherein the plurality of metallization layers has a top metal layer, the top metal layer being further away from the semiconductor substrate than a remainder of the plurality of metallization layers, is provided. A first passivation layer is formed in physical contact with the top metal layer, wherein the first passivation layer is the first passivation layer over the semiconductor substrate and wherein the first passivation layer comprises a first dielectric material throughout the first passivation layer. A first redistribution layer is formed in electrical connection with the top metal layer, wherein the first redistribution layer comprises a first material. A first protective layer is formed over the first redistribution layer and in physical contact with the first passivation layer, and a first conductive via is formed through the first protective layer and in physical contact with the first redistribution layer, the first conductive via comprising a second material different from the first material and having a thickness of less than about 10 µm. The semiconductor substrate is encapsulated with an encapsulant, wherein after the encapsulating the first conductive via is free from contact with the encapsulant. A second protective layer is deposited over the first conductive via and the encapsulant, and a post-passivation interconnect is formed over the second protective layer, the post-passivation interconnect in electrical connection with the first conductive via and extending over the encapsulant.

In accordance with yet another embodiment, a semiconductor device comprising a semiconductor substrate and a top metal layer over the semiconductor substrate is provided. A first passivation layer is over and in physical contact with the top metal layer, and a first redistribution layer over and in physical contact with the first passivation layer. A first polymer layer is over and in physical contact with the first redistribution layer, and an encapsulant is in physical contact with the semiconductor substrate, the first passivation layer, and the first polymer layer. A first conductive via extends through the first polymer layer and in electrical connection with the first redistribution layer, the first conductive via being laterally separated from the encapsulant and having a thickness of no greater than 10 µm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device comprising:
   a first redistribution line over a semiconductor substrate;
   a first polymer layer over the first redistribution line;
   a first conductive feature extending through the first polymer layer to contact the first redistribution line;
   an encapsulant encapsulating the semiconductor substrate, wherein the encapsulant extends to a first upper surface of the first polymer layer, wherein a second upper surface of the first polymer layer is disposed above a top surface of the encapsulant;
   a second polymer layer over the encapsulant, the first redistribution line, and the first conductive feature, the second polymer layer comprising a bottom surface extending below a top surface of the first polymer layer, the bottom surface comprising an inclined portion; and
   a first fan-out redistribution line over the second polymer layer and connected to the first conductive feature.
2. The semiconductor device of claim 1, wherein the bottom surface of the second polymer layer further comprises a first flat portion extending to an edge of the second polymer layer.
3. The semiconductor device of claim 2, wherein the bottom surface of the second polymer layer further comprises a second flat portion in contact with the first polymer layer, the inclined portion extending from the first flat portion to the second flat portion.
4. The semiconductor device of claim 3, wherein the inclined portion is curved in a cross-sectional view.
5. The semiconductor device of claim 3, wherein the inclined portion is linear in a cross-sectional view.
6. The semiconductor device of claim 1, wherein the first conductive feature has a first portion extending above a top surface of the first polymer layer, the first portion having a height less than 15 µm.
7. The semiconductor device of claim 1, wherein the first fan-out redistribution line comprises aluminum, the first conductive feature comprises copper, and the first polymer layer comprises polyimide.
8. A semiconductor device comprising:
   an active device on a first side of a semiconductor substrate;
   a plurality of metallization lines over the active device;
   a first passivation layer over the plurality of metallization lines, the first passivation layer comprising a first dielectric material throughout the first passivation layer;
   a first redistribution line coupled to the plurality of metallization lines, the first redistribution line comprising a first conductive material;
   a first protective layer over the first redistribution line, the first protective layer physically contacting the first passivation layer;
   a first conductive feature coupled to the first redistribution line and extending through the first protective layer, the first conductive feature comprising a second conductive material different from the first conductive material;
   an encapsulant encapsulating the semiconductor substrate;
   a second protective layer over the first conductive feature and the encapsulant, the second protective layer physically contacting sidewalls of the first conductive feature, a bottom surface of the second protective layer comprising a first flat portion in physical contact with a first upper surface of the first protective layer and a second flat portion in physical contact with a second upper surface of the first protective layer, wherein the second upper surface is above the first upper surface; and a post-passivation interconnect coupled to the first conductive feature and disposed over the second protective layer, the post-passivation interconnect extending over the encapsulant.

9. The semiconductor device of claim 8, wherein:
the semiconductor substrate comprises a second side opposite the first side;
the first protective layer comprises a first surface facing away from the semiconductor substrate; and
the encapsulant has a thickness that is no greater than a distance from the second side of the semiconductor substrate to the first surface of the first protective layer.

10. The semiconductor device of claim 8, wherein the bottom surface of the second protective layer further comprises an inclined portion extending from the first flat portion to the second flat portion.

11. The semiconductor device of claim 10, wherein the first protective layer comprises a multilayer structure.

12. The semiconductor device of claim 11, wherein the multilayer structure comprises a layer of silicon oxide and a layer of silicon nitride.

13. The semiconductor device of claim 8, wherein the first redistribution line comprises a first extension and a second extension extending through the first passivation layer to physically contact a metallization line of the plurality of metallization lines, the first extension being separated from the second extension by a portion of the first passivation layer.

14. A semiconductor device comprising:
a semiconductor substrate;
a top metal line over the semiconductor substrate;
a first passivation layer over the top metal line;
a first redistribution line over the first passivation layer;
a first polymer layer over the first redistribution line, the first polymer layer having a non-planar upper surface;
an encapsulant surrounding the semiconductor substrate, the first passivation layer, and the first polymer layer; and
a first conductive feature extending through the first polymer layer and coupled to the first redistribution line, wherein a top surface of the first conductive feature extends above a top surface of the encapsulant and a top surface of the first polymer layer, and wherein the first conductive feature comprises a seed layer extending from on the top surface of the first polymer layer to on a top surface of the first redistribution line.

15. The semiconductor device of claim 14, wherein at least a portion a first sidewall of the first polymer layer extends above the encapsulant.

16. The semiconductor device of claim 15, wherein a second sidewall of the first polymer layer is completely covered by the encapsulant in a cross-sectional view.

17. The semiconductor device of claim 14, wherein the first redistribution line comprises aluminum and the first conductive feature comprises copper.

18. The semiconductor device of claim 14, further comprising a second polymer layer over the first polymer layer, the second polymer layer contacting the encapsulant.

19. The semiconductor device of claim 18, further comprising a second redistribution line coupled to and disposed over the first conductive feature, the second redistribution line extending through the second polymer layer, the second redistribution line extending laterally over the encapsulant.

20. The semiconductor device of claim 14, wherein the first polymer layer has a first portion with a first thickness and a second portion with a second thickness greater than the first thickness, wherein the first thickness is in a range between 1 µm and 4 µm, wherein the second thickness is in a range between 2 µm and 14 µm.

* * * * *